United States Patent
Morishita

(10) Patent No.: US 10,755,888 B2
(45) Date of Patent: Aug. 25, 2020

(54) ABERRATION CORRECTOR AND CHARGED PARTICLE BEAM DEVICE

(71) Applicant: JEOL Ltd., Tokyo (JP)

(72) Inventor: Shigeyuki Morishita, Tokyo (JP)

(73) Assignee: JEOL Ltd., Tokyo (JP)

(*) Notice: Subject to any disclaimer, the term of this patent is extended or adjusted under 35 U.S.C. 154(b) by 0 days.

(21) Appl. No.: 16/364,726

(22) Filed: Mar. 26, 2019

(65) Prior Publication Data
US 2019/0304739 A1 Oct. 3, 2019

(30) Foreign Application Priority Data

Mar. 30, 2018 (JP) .................................. 2018-067698

(51) Int. Cl.
*H01J 37/10* (2006.01)
*H01J 37/28* (2006.01)
*H01J 37/153* (2006.01)

(52) U.S. Cl.
CPC ............ *H01J 37/10* (2013.01); *H01J 37/153* (2013.01); *H01J 37/28* (2013.01); *H01J 2237/103* (2013.01); *H01J 2237/1516* (2013.01); *H01J 2237/1532* (2013.01); *H01J 2237/1534* (2013.01); *H01J 2237/2802* (2013.01)

(58) Field of Classification Search
CPC ............ H01J 37/153; H01J 2237/1534; H01J 2237/1532; H01J 2237/2802; H01J 37/28; H01J 2237/1506; H01J 2237/223; H01J 2237/28; H01J 37/12; H01J 37/141; H01J 37/145; H01J 37/1471; H01J 37/1478; H01J 37/222; H01J 37/26; H01J 37/265
USPC ......................................... 250/396 R, 396 ML
See application file for complete search history.

(56) References Cited

U.S. PATENT DOCUMENTS

| | | | |
|---|---|---|---|
| 2003/0034457 A1* | 2/2003 | Rose | H01J 37/153 250/396 R |
| 2011/0114852 A1* | 5/2011 | Henstra | H01J 37/153 250/396 R |
| 2011/0284758 A1* | 11/2011 | Sawada | H01J 37/153 250/396 ML |
| 2017/0236681 A1* | 8/2017 | Morishita | H01J 37/145 250/396 ML |
| 2017/0365442 A1* | 12/2017 | Morishita | H01J 37/153 |

OTHER PUBLICATIONS

Extended European search report issued in EP19164086.1 dated Aug. 2, 2019.
Rose, Harald; "Outline of a spherically corrected semiaplanatic medium-voltage transmission electron microscope"; Optik; 1990; pp. 19-24; vol. 85.

(Continued)

*Primary Examiner* — David A Vanore
(74) *Attorney, Agent, or Firm* — The Webb Law Firm

(57) ABSTRACT

An aberration corrector includes: a first multipole, a second multipole, a third multipole, and a fourth multipole arranged along an optical axis A; a first transfer lens system arranged between the first multipole and the second multipole; a second transfer lens system arranged between the second multipole and the third multipole; and a third transfer lens system arranged between the third multipole and the fourth multipole, wherein each of the first multipole, the second multipole, the third multipole, and the fourth multipole generates a three-fold symmetric field.

11 Claims, 6 Drawing Sheets

(56) References Cited

OTHER PUBLICATIONS

Haider et al.; "Electron microscopy image enhanced"; Scientific Correspondence; Apr. 23, 1998; pp. 768-769; vol. 392; Nature Macmillan Publishers Ltd.
Muller et al.; "Advancing the Flexapole Cs-Corrector for the Scanning Transmission Electron Microscope"; Microscopy and Microanalysis; 2006; pp. 442-455; vol. 12; Microscopy Society of America.
Sawada et al.; "Correction of higher order geometrical aberration by triple 3-fold astigmatism field"; Journal of Electron Microscopy; 2009; pp. 341-347; vol. 58(6); published by Oxford University Press on behalf of Japanese Society of Microscopy.
Sawada et al.; "High-order aberration corrector for an image-forming system in a transmission electron microscope"; Ultramicroscopy; 2010; pp. 956-961; vol. 110; published by Elsevier.

\* cited by examiner

US 10,755,888 B2

ABERRATION CORRECTOR AND CHARGED PARTICLE BEAM DEVICE

CROSS-REFERENCE TO RELATED APPLICATION

This application claims priority to Japanese Patent Application No. 2018-067698 filed Mar. 30, 2018, the disclosure of which is hereby incorporated by reference in its entirety.

BACKGROUND OF THE INVENTION

Field of the Invention

The present invention relates to an aberration corrector and a charged particle beam device.

Description of Related Art

In electron microscopes such as a transmission electron microscope (TEM) and a scanning electron microscope (SEM), aberration correction is an important technique in terms of acquiring a high resolution image.

For example, a two-stage three-fold-field type Cs corrector in which hexapoles are arranged in two stages is disclosed in: H. Rose (*Optik*, vol. 85, (1990) pp. 19-24); H. Haider et al. (*Nature*, vol. 392 (1998) pp. 768-769); H. Muller, et al. (Microsc. Microanal. 12, (2006) 442-455). In the Cs corrector disclosed in: H. Rose (*Optik*, vol. 85, (1990) pp. 19-24); H. Haider et al. (*Nature*, vol. 392 (1998) pp. 768-769); H. Muller, et al. (*Microsc. Microanal.* 12, (2006) 442-455), a positive spherical aberration of an objective lens is corrected by a negative spherical aberration created by the hexapoles. In a two-stage three-fold-field type Cs corrector, although a six-fold astigmatism that is a fifth-order aberration in terms of geometrical aberration remains as a largest aberration, the six-fold astigmatism can be corrected by adjusting a thickness of multipoles and the like.

In addition, a three-stage three-fold-field type Cs corrector in which three-fold symmetric fields are arranged in three stages is disclosed in H. Sawada et al. (*Journal of Electron Microscopy*, vol. 58 (2009) pp. 341-347) and H. Sawada et al. (*Ultramicroscopy* 110 (2010) 958-961). In the three-stage three-fold-field type Cs corrector, a six-fold astigmatism that is difficult to correct with the two-stage three-fold-field type Cs corrector described above is corrected by arranging three-fold fields in three stages.

As described above, in a two-stage three-fold-field type Cs corrector, a six-fold astigmatism can be corrected by adjusting a thickness of multipoles and the like. However, even if the six-fold astigmatism is corrected, a sixth-order three-lobe aberration that is a sixth-order aberration in terms of geometrical aberration (a seventh-order aberration in terms of wave aberration) cannot be corrected and remains as an aberration that restricts an aberration-corrected range.

In addition, in a three-stage three-fold-field type Cs corrector, a six-fold astigmatism can be corrected as described above. However, in the three-stage three-fold-field type Cs corrector, a sixth-order three-lobe aberration remains as a largest aberration after correcting a six-fold astigmatism in a similar manner to a two-stage three-fold-field type Cs corrector.

SUMMARY OF THE INVENTION

The invention can provide an aberration corrector and a charged particle beam device capable of correcting a sixth-order three-lobe aberration.

According to a first aspect of the invention, there is provided an aberration corrector including:
a first multipole, a second multipole, a third multipole, and a fourth multipole arranged along an optical axis;
a first transfer lens system arranged between the first multipole and the second multipole;
a second transfer lens system arranged between the second multipole and the third multipole; and
a third transfer lens system arranged between the third multipole and the fourth multipole,
each of the first multipole, the second multipole, the third multipole, and the fourth multipole generating a three-fold symmetric field.

According to a first aspect of the invention, there is provided a charged particle beam device including the aberration corrector described above.

DESCRIPTION OF THE INVENTION

According to an embodiment of the invention, there is provided an aberration corrector including:
a first multipole, a second multipole, a third multipole, and a fourth multipole arranged along an optical axis;
a first transfer lens system arranged between the first multipole and the second multipole;
a second transfer lens system arranged between the second multipole and the third multipole; and
a third transfer lens system arranged between the third multipole and the fourth multipole,
each of the first multipole, the second multipole, the third multipole, and the fourth multipole generating a three-fold symmetric field.

In such an aberration corrector, since the first multipole, the second multipole, the third multipole, and the fourth multipole respectively generate a three-fold symmetric field, a spherical aberration and a sixth-order three-lobe aberration can be corrected.

According to an embodiment of the invention, there is provided a charged particle beam device including the aberration corrector described above.

In such a charged particle beam device, a sixth-order three-lobe aberration can be corrected and resolution can be improved.

Embodiments of the invention are described in detail below with reference to the drawings. Note that the following embodiments do not unduly limit the scope of the invention as stated in the claims. In addition, all of the elements described in connection with the following embodiments should not necessarily be taken as essential requirements of the invention.

Furthermore, while the charged particle beam device according to an embodiment of the invention will be described below by using an electron microscope that performs an observation, an analysis, and the like of a specimen by irradiating an electron beam as an example, the charged particle beam device according to the invention may be an apparatus that performs an observation, an analysis, and the like of a specimen by irradiating a charged particle beam (such as an ion beam) other than an electron beam.

1. First Embodiment

Figure 1:
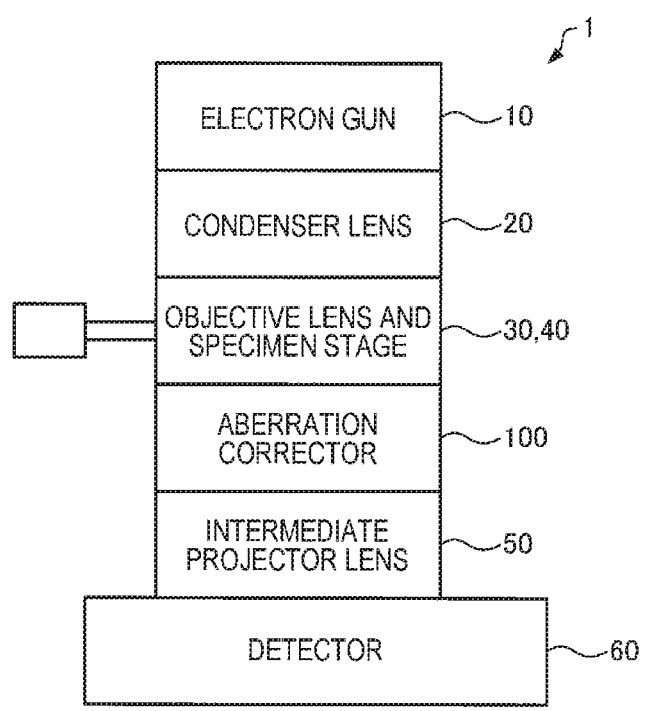
FIG. 1 is a diagram illustrating a configuration of an electron microscope according to a first embodiment.

First, an electron microscope according to a first embodiment will be described with reference to the drawings. FIG. 1 is a diagram illustrating a configuration of an electron microscope 1 according to the first embodiment.

The electron microscope 1 includes an aberration corrector according to an embodiment of the invention. A case where an aberration corrector 100 is included as the aberration corrector according to an embodiment of the invention will now be described.

As illustrated in FIG. 1, the electron microscope 1 is configured so as to include an electron gun 10, a condenser lens 20, an objective lens 30, a specimen stage 40, the aberration corrector 100, an intermediate projector lens 50, and a detector 60. In the electron microscope 1, the aberration corrector 100 is used in order to correct an aberration of an imaging system.

The electron gun 10 generates an electron beam. The condenser lens 20 focuses the electron beam emitted from the electron gun 10. The condenser lens 20 constitutes an illumination system for illuminating a specimen with the electron beam. The objective lens 30 is a lens in a first stage for forming an image with the electron beam having been transmitted through the specimen. The specimen stage 40 holds the specimen. The intermediate projector lens 50 cooperates with the objective lens 30 to constitute an imaging system for forming an image with the electron beam having been transmitted through the specimen. The intermediate projector lens 50 forms an image on the detector 60 inside an observation chamber. Accordingly, the detector 60 can photograph a transmission electron microscope image.

The aberration corrector 100 is built into the imaging system of the electron microscope 1. The aberration corrector 100 corrects a spherical aberration of the imaging system (the objective lens 30). Specifically, in the aberration corrector 100, a positive spherical aberration of the imaging system is canceled out by a negative spherical aberration generated by the aberration corrector 100.

Figure 2:
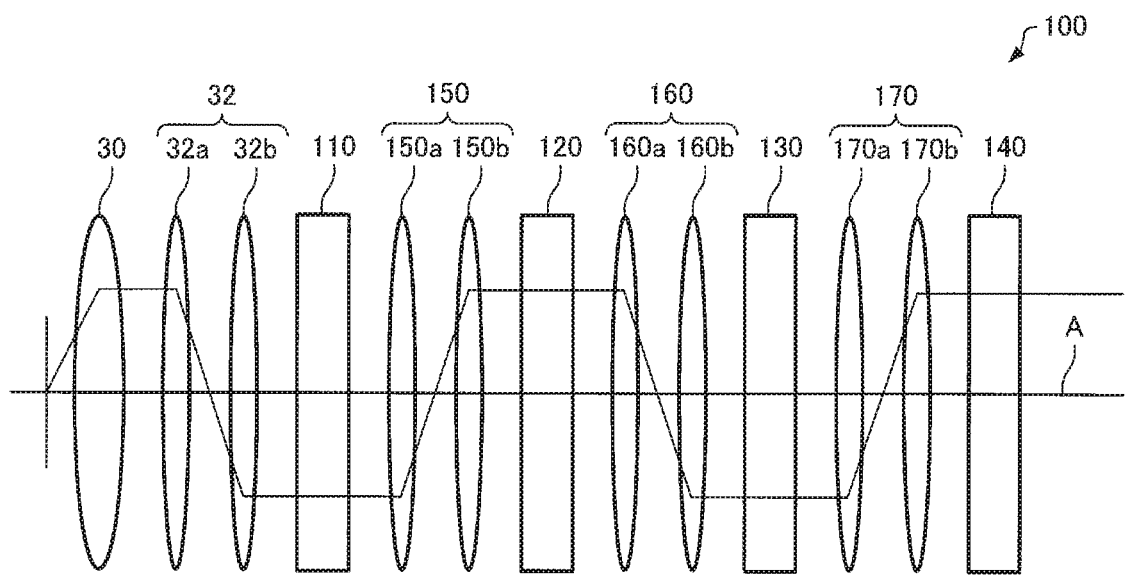
FIG. 2 is a diagram illustrating a configuration of an aberration corrector.

FIG. 2 is a diagram illustrating a configuration of the aberration corrector 100.

As illustrated in FIG. 2, the aberration corrector 100 is arranged behind the objective lens 30. A transfer lens system 32 is arranged between the objective lens 30 and the aberration corrector 100 (a first multipole 110). The transfer lens system 32 is constituted by a pair of transfer lenses (a first transfer lens 32a and a second transfer lens 32b).

The aberration corrector 100 includes four-stage multipoles (the first multipole 110, a second multipole 120, a third multipole 130, and a fourth multipole 140) and three transfer lens systems (a first transfer lens system 150, a second transfer lens system 160, and a third transfer lens system 170).

The first multipole 110, the second multipole 120, the third multipole 130, and the fourth multipole 140 are arranged along an optical axis A. The four-stage multipoles are arranged in an order of the first multipole 110, the second multipole 120, the third multipole 130, and the fourth multipole 140 from the side of the objective lens 30.

The first multipole 110 generates a three-fold symmetric field. A three-fold symmetric field refers to a field of which an intensity has three-fold symmetry. The three-fold symmetric field generated by the first multipole 110 is an electric field having three-fold symmetry, a magnetic field having three-fold symmetry, or a crossed field of a magnetic field and an electric field having three-fold symmetry. The first multipole 110 is, for example, a hexapole or a dodecapole. Note that the first multipole 110 need only be capable of generating a three-fold symmetric field and is not limited to a hexapole or a dodecapole.

The first multipole 110 is has a thickness along the optical axis A. In a multipole having a thickness, an aberration that differs from an aberration generated in a thin multipole appears as a combination aberration. In a multipole that generates a three-fold symmetric field, a negative spherical aberration is created as a combination aberration. The aberration corrector 100 uses this negative spherical aberration to correct a positive spherical aberration of an imaging system. In addition, in a multipole having a thickness along the optical axis A and which generates a three-fold symmetric field, a fourth-order three-lobe aberration, a six-fold astigmatism, a fifth-order spherical aberration, and a sixth-order three-lobe aberration are generated as combination aberrations in addition to the negative spherical aberration.

Configurations of the second multipole 120, the third multipole 130, and the fourth multipole 140 are the same as the configuration of the first multipole 110. In other words, the second multipole 120, the third multipole 130, and the fourth multipole 140 respectively generate three-fold symmetric fields. The second multipole 120, the third multipole 130, and the fourth multipole 140 each have a thickness along the optical axis A.

The first transfer lens system 150 is arranged between the first multipole 110 and the second multipole 120. The first transfer lens system 150 is constituted by a pair of transfer lenses (a first transfer lens 150a and a second transfer lens 150b). The first transfer lens system 150 forms, in the second multipole 120, an image conjugate to an image formed by the first multipole 110.

The second transfer lens system 160 is arranged between the second multipole 120 and the third multipole 130. The second transfer lens system 160 is constituted by a pair of transfer lenses (a first transfer lens 160a and a second transfer lens 160b). The second transfer lens system 160 forms, in the third multipole 130, an image conjugate to an image formed by the second multipole 120.

The third transfer lens system 170 is arranged between the third multipole 130 and the fourth multipole 140. The third transfer lens system 170 is constituted by a pair of transfer lenses (a first transfer lens 170a and a second transfer lens 170b). The third transfer lens system 170 forms, in the fourth multipole 140, an image conjugate to an image formed by the third multipole 130.

It should be noted that the transfer lenses constituting the first transfer lens system 150, the second transfer lens system 160, and the third transfer lens system 170 may be a rotationally symmetric (axially symmetric) lens or may be a multipole lens as long as a conjugate image can be formed.

Figure 3:
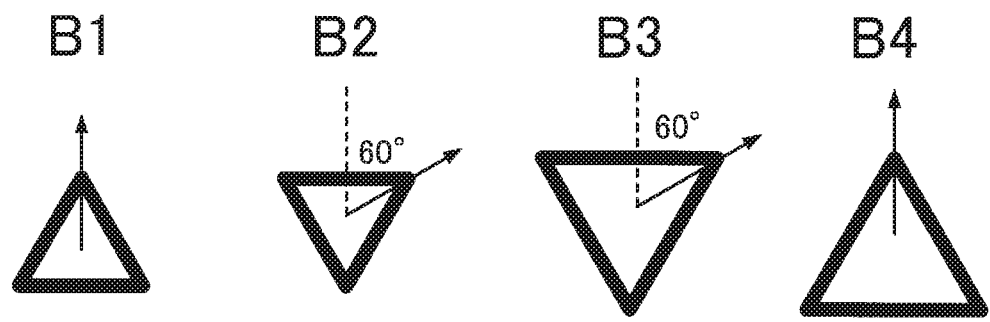
FIG. 3 is a diagram illustrating a relationship among a three-fold astigmatism created by a three-fold symmetric field generated by a first multipole, a three-fold astigmatism created by a three-fold symmetric field generated by a second multipole, a three-fold astigmatism created by a three-fold symmetric field generated by a third multipole, and a three-fold astigmatism created by a three-fold symmetric field generated by a fourth multipole.

FIG. 3 is a diagram illustrating a relationship among a three-fold astigmatism B1 created by a three-fold symmetric field generated by the first multipole 110, a three-fold astigmatism B2 created by a three-fold symmetric field generated by the second multipole 120, a three-fold astigmatism B3 created by a three-fold symmetric field generated by the third multipole 130, and a three-fold astigmatism B4 created by a three-fold symmetric field generated by the fourth multipole 140.

An intensity of the three-fold astigmatism B1 created by the three-fold symmetric field generated by the first multipole 110 is equal to an intensity of the three-fold astigmatism B2 created by the three-fold symmetric field generated by the second multipole 120. In addition, an orientation of the three-fold astigmatism B2 created by the three-fold symmetric field generated by the second multipole 120 is an orientation obtained by rotating the three-fold astigmatism B1 created by the three-fold symmetric field generated by the first multipole 110 by 60 degrees. In other words, the three-fold astigmatism B2 created by the three-fold symmetric field generated by the second multipole 120 is a field obtained by rotating, around the optical axis A by 60 degrees, the three-fold astigmatism B1 created by the three-fold symmetric field generated by the first multipole 110. An orientation of a three-fold symmetric field generated by a multipole is the same as an orientation of a three-fold astigmatism created by the three-fold symmetric field generated by the multipole. In other words, an orientation of the three-fold symmetric field generated by the second multipole 120 is an orientation obtained by rotating the three-fold symmetric field generated by the first multipole 110 by 60 degrees.

An intensity of the three-fold astigmatism B3 created by the three-fold symmetric field generated by the third multipole 130 is equal to an intensity of the three-fold astigmatism B4 created by the three-fold symmetric field generated by the fourth multipole 140. In addition, an orientation of the three-fold astigmatism B4 created by the three-fold symmetric field generated by the fourth multipole 140 is an orientation obtained by rotating the three-fold astigmatism B3 created by the three-fold symmetric field generated by the third multipole 130 by 60 degrees. In other words, the three-fold astigmatism B4 created by the three-fold symmetric field generated by the fourth multipole 140 is a field obtained by rotating, around the optical axis A by 60 degrees, the three-fold astigmatism B3 created by the three-fold symmetric field generated by the third multipole 130. In other words, an orientation of the three-fold symmetric field generated by the third multipole 130 is an orientation obtained by rotating the three-fold symmetric field generated by the fourth multipole 140 by 60 degrees.

An orientation of the three-fold astigmatism B2 created by the three-fold symmetric field generated by the second multipole 120 is the same as an orientation of the three-fold astigmatism B3 created by the three-fold symmetric field generated by the third multipole 130. In other words, an orientation of the three-fold symmetric field generated by the second multipole 120 is the same as an orientation of the three-fold symmetric field generated by the third multipole 130. In addition, an intensity of the three-fold astigmatism B2 created by the three-fold symmetric field generated by the second multipole 120 is lower than an intensity of the three-fold astigmatism B3 created by the three-fold symmetric field generated by the third multipole 130. For example, a ratio B2:B3 of the intensity of the three-fold astigmatism B2 created by the three-fold symmetric field generated by the second multipole 120 to the intensity of the three-fold astigmatism B3 created by the three-fold symmetric field generated by the third multipole 130 is B2:B3=1:x, where x is 0.4<x<0.8. The ratio B2:B3 is set in accordance with a focal length of the objective lens 30, a spherical aberration coefficient of the objective lens 30, a transfer magnification, a focal length of the transfer lenses, a spherical aberration coefficient of the transfer lenses, a thickness of the multipoles, and the like.

Figure 4:
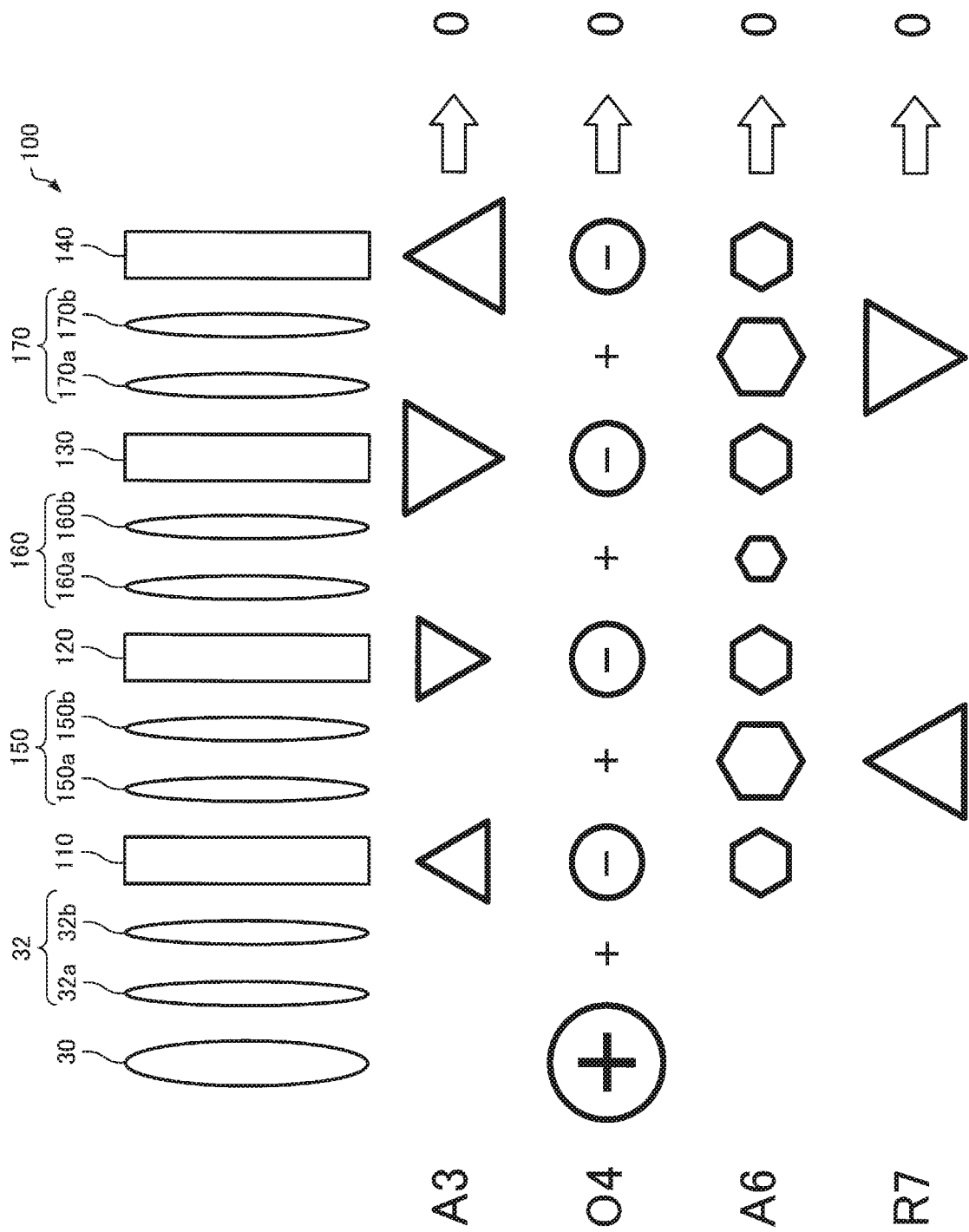
FIG. 4 is a diagram illustrating a function of an aberration corrector.

FIG. 4 is a diagram illustrating a function of the aberration corrector 100. In the aberration corrector 100, by generating the three-fold astigmatisms B1, B2, B3, and B4 illustrated in FIG. 3 described above in the four-stage multipoles (the first multipole 110, the second multipole 120, the third multipole 130, and the fourth multipole 140), a three-fold astigmatism, a spherical aberration, a six-fold astigmatism, and a sixth-order three-lobe aberration can be corrected as will be described below. It should be noted that aberrations (a coma aberration, a star aberration, and the like) other than the aberrations illustrated in FIG. 4 can be corrected using a deflection coil (not illustrated) mounted to the aberration corrector 100.

<Three-Fold Astigmatism A3>

Three-fold astigmatisms are respectively generated in the first multipole 110 and the second multipole 120. The three-fold astigmatism generated in the first multipole 110 and the three-fold astigmatism generated in the second multipole 120 cancel each other out.

Three-fold astigmatisms are respectively generated in the third multipole 130 and the fourth multipole 140. The three-fold astigmatism generated in the third multipole 130 and the three-fold astigmatism generated in the fourth multipole 140 cancel each other out. Therefore, in the aberration corrector 100, for example, the three-fold astigmatism can be made zero.

<Spherical Aberration O4>

The first multipole 110 generates a negative spherical aberration. In a similar manner, the second multipole 120, the third multipole 130, and the fourth multipole 140 respectively generate negative spherical aberrations. A positive spherical aberration of the imaging system can be corrected using the negative spherical aberrations generated by the four-stage multipoles.

<Six-Fold Astigmatism A6>

A six-fold astigmatism is created by the three-fold symmetric field generated by the first multipole 110. In a similar manner, a six-fold astigmatism is created by the three-fold symmetric field generated by the second multipole 120. In a similar manner, a six-fold astigmatism is created by the three-fold symmetric field generated by the third multipole 130. In a similar manner, a six-fold astigmatism is created by the three-fold symmetric field generated by the fourth multipole 140. In addition, a six-fold astigmatism is also created as a combination aberration of the three-fold symmetric fields generated by the first multipole 110, the second multipole 120, the third multipole 130, and the fourth multipole 140.

Furthermore, spherical aberrations are respectively created in the first transfer lens system 150, the second transfer lens system 160, and the third transfer lens system 170. A six-fold astigmatism is created by a combination aberration of the spherical aberrations created in the transfer lens systems and the aberrations created by the three-fold symmetric fields generated by the multipoles 110, 120, 130, and 140.

In the aberration corrector 100, a six-fold astigmatism of the aberration corrector 100 as a whole is corrected by achieving a balance between the six-fold astigmatism generated by the three-fold symmetric fields respectively generated by the first multipole 110, the second multipole 120, the third multipole 130, and the fourth multipole 140 and the six-fold astigmatism generated by the combination aberration of the spherical aberrations created in the transfer lens systems 150, 160, and 170 and the aberrations created by the three-fold symmetric fields generated by the multipoles. Accordingly, for example, the six-fold astigmatism can be made zero in the aberration corrector 100 as a whole.

<Sixth-Order Three-Lobe Aberration R7>

In the aberration corrector 100, a sixth-order three-lobe aberration generated in the first multipole 110 and the second multipole 120 and a sixth-order three-lobe aberration generated in the third multipole 130 and the fourth multipole 140 cancel each other out. Accordingly, in the aberration corrector 100, a sixth-order three-lobe aberration can be corrected and, for example, the sixth-order three-lobe aberration can be made zero in the aberration corrector 100 as a whole.

For example, the aberration corrector 100 has the following features.

The aberration corrector 100 includes: the first multipole 110, the second multipole 120, the third multipole 130, and the fourth multipole 140 which generate three-fold symmetric fields; the first transfer lens system 150 arranged between the first multipole 110 and the second multipole 120; the second transfer lens system 160 arranged between the second multipole 120 and the third multipole 130; and the third transfer lens system 170 arranged between the third multipole 130 and the fourth multipole 140. Therefore, in the aberration corrector 100, as described above, a spherical aberration of an imaging system can be corrected and a sixth-order three-lobe aberration generated in the aberration corrector 100 can be corrected.

In the aberration corrector 100, the first multipole 110, the second multipole 120, the third multipole 130, and the fourth multipole 140 are arranged in an order of the first multipole 110, the second multipole 120, the third multipole 130, and the fourth multipole 140 from the side of the objective lens 30. In addition, an intensity of the three-fold astigmatism B1 created by the three-fold symmetric field generated by the first multipole 110 is equal to an intensity of the three-fold astigmatism B2 created by the three-fold symmetric field generated by the second multipole 120, and an orientation of the three-fold astigmatism B2 is an orientation obtained by rotating the three-fold astigmatism B1 by 60 degrees. Furthermore, an intensity of the three-fold astigmatism B3 created by the three-fold symmetric field generated by the third multipole 130 is equal to an intensity of the three-fold astigmatism B4 created by the three-fold symmetric field generated by the fourth multipole 140, and an orientation of the three-fold astigmatism B4 is an orientation obtained by rotating the three-fold astigmatism B3 by 60 degrees.

In addition, the orientation of the three-fold astigmatism B2 and the orientation of the three-fold astigmatism B3 are the same. Furthermore, the intensity of the three-fold astigmatism B2 is lower than the intensity of the three-fold astigmatism B3.

Therefore, in the aberration corrector 100, a spherical aberration of an imaging system can be corrected and, at the same time, a three-fold astigmatism, a six-fold astigmatism, and a sixth-order three-lobe aberration can be corrected.

In the aberration corrector 100, a sixth-order three-lobe aberration generated in the first multipole 110 and the second multipole 120 and a sixth-order three-lobe aberration generated in the third multipole 130 and the fourth multipole 140 cancel each other out. Therefore, in the aberration corrector 100, a sixth-order three-lobe aberration can be corrected.

In the aberration corrector 100, the first multipole 110, the second multipole 120, the third multipole 130, and the fourth multipole 140 generate negative spherical aberrations. Therefore, in the aberration corrector 100, a positive spherical aberration of an imaging system can be canceled out.

In the aberration corrector 100, a three-fold astigmatism generated in the first multipole 110 and a three-fold astigmatism generated in the second multipole 120 cancel each other out, and a three-fold astigmatism generated in the third multipole 130 and a three-fold astigmatism generated in the fourth multipole 140 cancel each other out. Therefore, in the aberration corrector 100, a three-fold astigmatism can be corrected.

In the aberration corrector 100, a six-fold astigmatism is corrected by: a six-fold astigmatism generated by the three-fold symmetric fields respectively generated by the first multipole 110, the second multipole 120, the third multipole 130, and the fourth multipole 140; and a six-fold astigmatism generated by a combination aberration of the spherical aberrations generated by the transfer lens systems 150, 160, and 170 and the aberrations created by the three-fold symmetric fields generated by the multipoles 110, 120, 130, and 140. Therefore, in the aberration corrector 100, a six-fold astigmatism can be corrected.

Since the electron microscope 1 includes the aberration corrector 100, a resolution of an electron microscope image can be improved.

While a case where a spherical aberration and a sixth-order three-lobe aberration are corrected by causing the three-fold symmetric fields illustrated in FIG. 3 described above to be generated in the four-stage multipoles (the first multipole 110, the second multipole 120, the third multipole 130, and the fourth multipole 140) has been described above, the relationship among the three-fold astigmatisms B1, B2, B3, and B4 created by the three-fold symmetric fields is not limited to the example illustrated in FIG. 3 as long as a spherical aberration and a sixth-order three-lobe aberration can be corrected.

2. Second Embodiment

Figure 5:
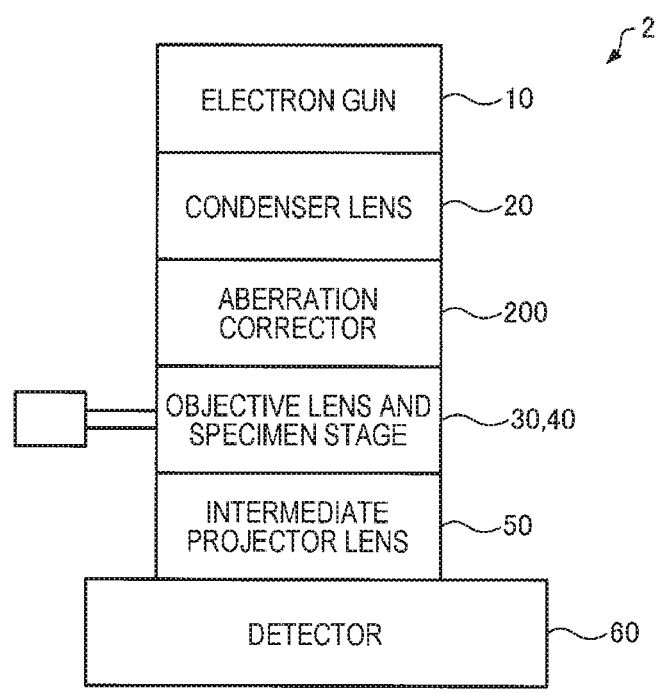
FIG. 5 is a diagram illustrating a configuration of an electron microscope according to a second embodiment.

Next, an electron microscope according to a second embodiment will be described with reference to the drawings. FIG. 5 is a diagram illustrating a configuration of an electron microscope 2 according to the second embodiment. Hereinafter, in the electron microscope 2 according to the second embodiment, members having similar functions to the components of the electron microscope 1 according to the first embodiment will be denoted by same reference characters and a detailed description thereof will be omitted.

The electron microscope 2 includes an aberration corrector according to an embodiment of the invention. A case where an aberration corrector 200 is included as the aberration corrector according to an embodiment of the invention will now be described.

In the electron microscope 1 described above, the aberration corrector 100 is built into the imaging system as illustrated in FIG. 1.

In contrast, in the electron microscope 2, the aberration corrector 200 is built into an illumination system as illustrated in FIG. 5.

The electron microscope 2 is configured so as to include the electron gun 10, the condenser lens 20, the aberration corrector 200, the objective lens 30, the specimen stage 40, the intermediate projector lens 50, and the detector 60.

The aberration corrector 200 is built into an illumination system of the electron microscope 2. The aberration corrector 200 corrects spherical aberration of the illumination system (the objective lens 30). Specifically, in the aberration corrector 200, a positive spherical aberration of the illumination system is canceled out by a negative spherical aberration generated by the aberration corrector 200.

Figure 6:
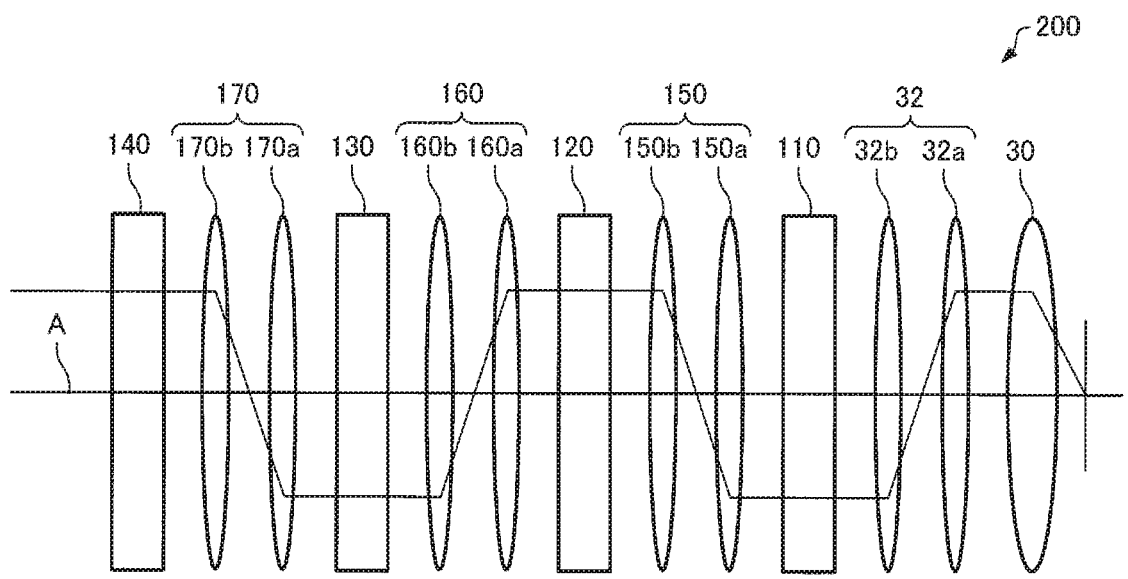
FIG. 6 is a diagram illustrating a configuration of an aberration corrector.

FIG. 6 is a diagram illustrating a configuration of the aberration corrector 200.

As illustrated in FIG. 6, the aberration corrector 200 is arranged in front of the objective lens 30. The transfer lens system 32 is arranged between the aberration corrector 200 (the first multipole 110) and the objective lens 30. The transfer lens system 32 is constituted by two transfer lenses (the first transfer lens 32a and the second transfer lens 32b).

The aberration corrector 200 includes four-stage multipoles (the first multipole 110, the second multipole 120, the third multipole 130, and the fourth multipole 140) and three transfer lens systems (the first transfer lens system 150, the second transfer lens system 160, and the third transfer lens system 170).

The first multipole 110, the second multipole 120, the third multipole 130, and the fourth multipole 140 are arranged along an optical axis A. The four-stage multipoles are arranged in an order of the first multipole 110, the second multipole 120, the third multipole 130, and the fourth multipole 140 from the side of the objective lens 30.

An arrangement of the four-stage multipoles in the aberration corrector 200 illustrated in FIG. 6 and an arrangement of the four-stage multipoles in the aberration corrector 100 illustrated in FIG. 2 are symmetrical with respect to the objective lens 30.

Figure 7:
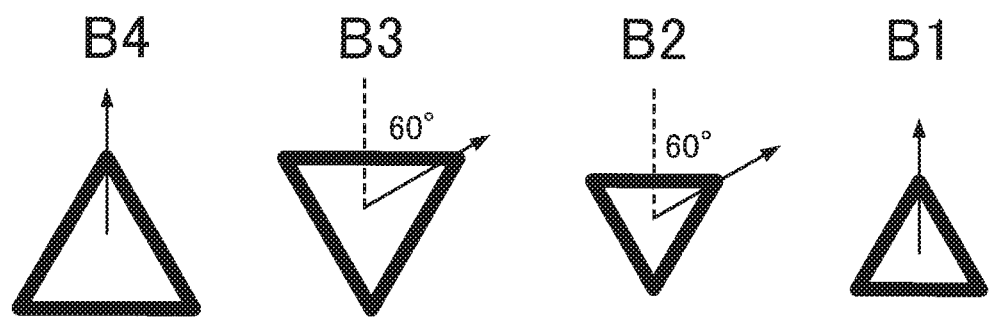
FIG. 7 is a diagram illustrating a relationship among a three-fold astigmatism created by a three-fold symmetric field generated by a first multipole, a three-fold astigmatism created by a three-fold symmetric field generated by a second multipole, a three-fold astigmatism created by a three-fold symmetric field generated by a third multipole, and a three-fold astigmatism created by a three-fold symmetric field generated by a fourth multipole.

FIG. 7 is a diagram illustrating a relationship among a three-fold astigmatism B1 created by a three-fold symmetric field generated by the first multipole 110, a three-fold astigmatism B2 created by a three-fold symmetric field generated by the second multipole 120, a three-fold astigmatism B3 created by a three-fold symmetric field generated by the third multipole 130, and a three-fold astigmatism B4 created by a three-fold symmetric field generated by the fourth multipole 140.

The relationship among the three-fold astigmatism B1 created by the three-fold symmetric field generated by the first multipole 110, the three-fold astigmatism B2 created by the three-fold symmetric field generated by the second multipole 120, the three-fold astigmatism B3 created by the three-fold symmetric field generated by the third multipole 130, and the three-fold astigmatism B4 created by the three-fold symmetric field generated by the fourth multipole 140 in the aberration corrector 200 is the same as the relationship among the three-fold astigmatism B1 created by the three-fold symmetric field generated by the first multipole 110, the three-fold astigmatism B2 created by the three-fold symmetric field generated by the second multipole 120, the three-fold astigmatism B3 created by the three-fold symmetric field generated by the third multipole 130, and the three-fold astigmatism B4 created by the three-fold symmetric field generated by the fourth multipole 140 in the aberration corrector 100 described earlier.

Specifically, the intensity of the three-fold astigmatism B1 is equal to the intensity of the three-fold astigmatism B2. In addition, the orientation of the three-fold astigmatism B2 is an orientation obtained by rotating the three-fold astigmatism B1 by 60 degrees. Furthermore, the intensity of the three-fold astigmatism B3 is equal to the intensity of the three-fold astigmatism B4. In addition, the orientation of the three-fold astigmatism B4 is an orientation obtained by rotating the three-fold astigmatism B3 by 60 degrees. Furthermore, the orientation of the three-fold astigmatism B2 and the orientation of the three-fold astigmatism B3 are the same. In addition, the intensity of the three-fold astigmatism B2 is lower than the intensity of the three-fold astigmatism B3.

Figure 8:
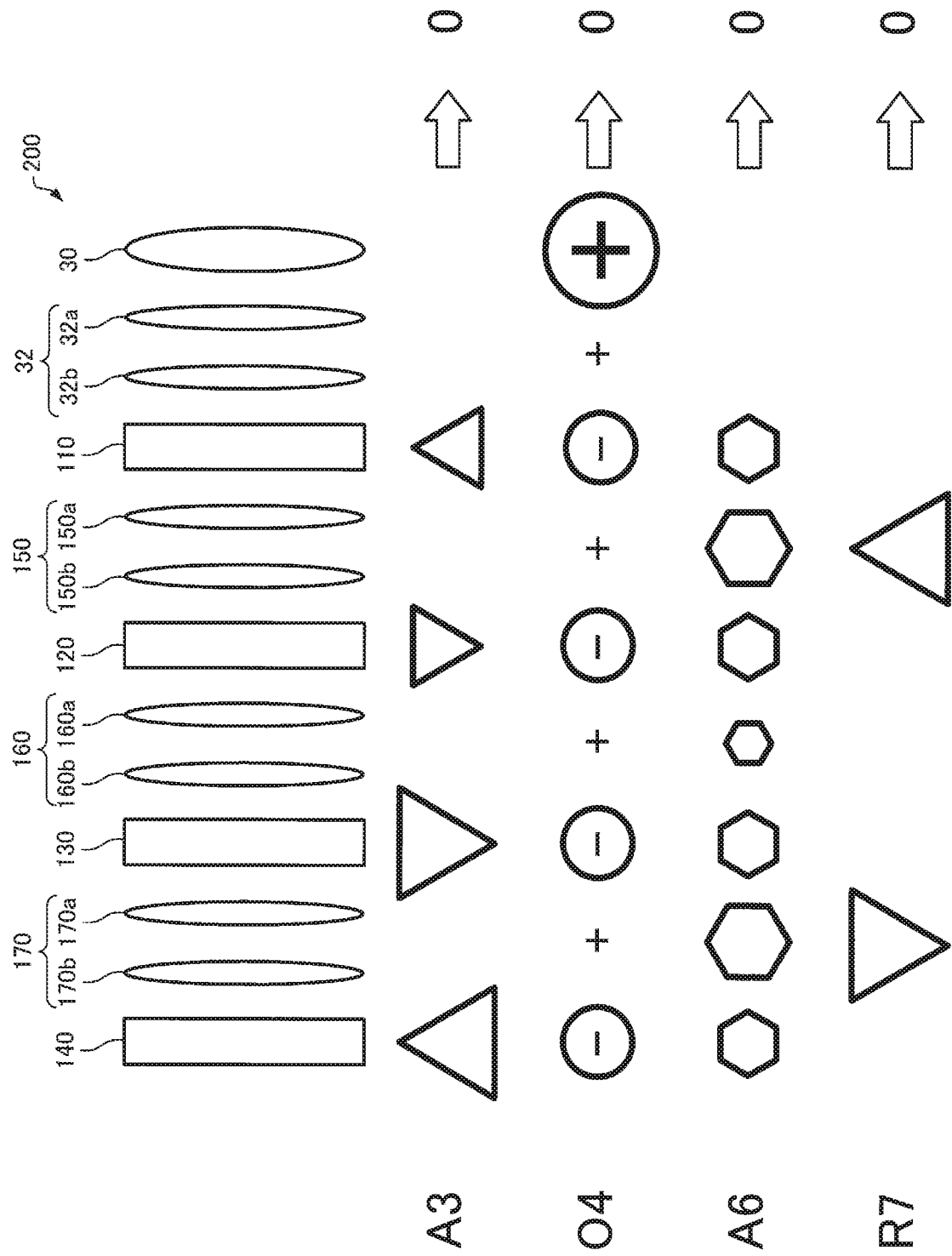
FIG. 8 is a diagram illustrating a function of an aberration corrector.

FIG. 8 is a diagram illustrating a function of the aberration corrector 200. In the aberration corrector 200, by generating the three-fold astigmatisms B1, B2, B3, and B4 illustrated in FIG. 7 described above in the four-stage multipoles (the first multipole 110, the second multipole 120, the third multipole 130, and the fourth multipole 140), a three-fold astigmatism, a spherical aberration, a six-fold astigmatism, and a sixth-order three-lobe aberration can be corrected as will be described below.

<Three-Fold Astigmatism A3>

Three-fold astigmatisms are respectively generated in the first multipole 110 and the second multipole 120. The three-fold astigmatism generated in the first multipole 110 and the three-fold astigmatism generated in the second multipole 120 cancel each other out.

Three-fold astigmatisms are respectively generated in the third multipole 130 and the fourth multipole 140. The three-fold astigmatism generated in the third multipole 130 and the three-fold astigmatism generated in the fourth multipole 140 cancel each other out. Therefore, in the aberration corrector 200, for example, the three-fold astigmatism can be made zero.

<Spherical Aberration O4>

The first multipole 110 generates a negative spherical aberration. In a similar manner, the second multipole 120, the third multipole 130, and the fourth multipole 140 respectively generate negative spherical aberrations. A positive spherical aberration of the illumination system can be corrected using the negative spherical aberrations generated by the four-stage multipoles.

<Six-Fold Astigmatism A6>

In the aberration corrector 200, a six-fold astigmatism of the aberration corrector 200 as a whole is corrected by achieving a balance between the six-fold astigmatism generated by the three-fold symmetric fields respectively generated by the first multipole 110, the second multipole 120, the third multipole 130, and the fourth multipole 140 and the six-fold astigmatism generated by the combination aberration of the spherical aberrations created in the transfer lens systems and the aberrations created by the three-fold symmetric fields generated by the multipoles in a similar manner to the aberration corrector 100. Accordingly, for example, the six-fold astigmatism can be made zero in the aberration corrector 200 as a whole.

<Sixth-Order Three-Lobe Aberration R7>

In the aberration corrector 200, a sixth-order three-lobe aberration generated in the first multipole 110 and the second multipole 120 and a sixth-order three-lobe aberration generated in the third multipole 130 and the fourth multipole 140 cancel each other out. Accordingly, in the aberration corrector 200, a sixth-order three-lobe aberration can be corrected and, for example, the sixth-order three-lobe aberration can be made zero in the aberration corrector 200 as a whole.

For example, the aberration corrector 200 has the following features.

The aberration corrector 200 can yield similar advantageous effects to the aberration corrector 100. Furthermore, in the aberration corrector 200, aberrations of an illumination system can be corrected.

The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

The invention claimed is:

1. An aberration corrector comprising:
   a first multipole, a second multipole, a third multipole and a fourth multipole arranged along an optical axis;
   a first transfer lens system arranged between the first multipole and the second multipole;
   a second transfer lens system arranged between the second multipole and the third multipole; and
   a third transfer lens system arranged between the third multipole and the fourth multipole,
   each of the first multipole, the second multipole, the third multipole, and the fourth multipole generating a three-fold symmetric field,
   a sixth-order three-lobe aberration generated in the first multipole and the second multipole and a sixth-order three-lobe aberration generated in the third multipole and the fourth multipole cancel each other out; and
   a six-fold astigmatism is corrected by:
   a six-fold astigmatism generated by the three-fold symmetric fields respectively generated by the first multipole, the second multipole, the third multipole, and the fourth multipole; and
   a six-fold astigmatism generated by a combination aberration of spherical aberrations respectively created in the first transfer lens system, the second transfer lens system, and the third transfer lens system and aberrations created by the three-fold symmetric fields respectively generated by the first multipole, the second multipole, the third multipole, and the fourth multipole.

2. The aberration corrector according to claim 1, wherein the first multipole, the second multipole, the third multipole, and the fourth multipole are arranged in an order of the first multipole, the second multipole, the third multipole, and the fourth multipole,
   an intensity of a three-fold astigmatism created by the three-fold symmetric field generated by the first multipole is equal to an intensity of a three-fold astigmatism created by the three-fold symmetric field generated by the second multipole,
   an orientation of the three-fold symmetric field generated by the second multipole is an orientation obtained by rotating the three-fold symmetric field generated by the first multipole by 60 degrees,
   an intensity of a three-fold astigmatism created by the three-fold symmetric field generated by the third multipole is equal to an intensity of a three-fold astigmatism created by the three-fold symmetric field generated by the fourth multipole, and
   an orientation of the three-fold symmetric field generated by the fourth multipole is an orientation obtained by rotating the three-fold symmetric field generated by the third multipole by 60 degrees.

3. The aberration corrector according to claim 1, wherein an orientation of the three-fold symmetric field generated by the second multipole and an orientation of the three-fold symmetric field generated by the third multipole are the same.

4. The aberration corrector according to claim 1, wherein an intensity of a three-fold astigmatism created by the three-fold symmetric field generated by the second multipole is lower than an intensity of a three-fold astigmatism created by the three-fold symmetric field generated by the third multipole.

5. The aberration corrector according to claim 1, wherein the first multipole, the second multipole, the third multipole, and the fourth multipole generate a negative spherical aberration.

6. The aberration corrector according to claim 1, wherein a three-fold astigmatism generated in the first multipole and a three-fold astigmatism generated in the second multipole cancel each other out, and
   a three-fold astigmatism generated in the third multipole and a three-fold astigmatism generated in the fourth multipole cancel each other out.

7. The aberration corrector according to claim 1, wherein the first multipole, the second multipole, the third multipole, and the fourth multipole are arranged in an order of the first multipole, the second multipole, the third multipole, and the fourth multipole from an objective lens side.

8. The aberration corrector according to claim 1, wherein the three-fold symmetric field generated by each of the first multipole, the second multipole, the third multipole, and the fourth multipole is a magnetic field having three-fold symmetry, an electric field having three-fold symmetry, or a crossed field of a magnetic field and an electric field having three-fold symmetry.

9. The aberration corrector according to claim 1, wherein the first multipole, the second multipole, the third multipole, and the fourth multipole are hexapoles or dodecapoles.

10. The aberration corrector according to claim 1, wherein each of the first multipole, the second multipole, the third multipole, and the fourth multipole has a thickness along an optical axis.

11. A charged particle beam device comprising:
   a specimen stage configured to hold the specimen;
   a charged particle beam generator configured to generate an electron beam;

a condenser lens configured to focus the electron beam emitted from the charged particle beam generator and illuminate the specimen;

an objective lens configured to form an image with the electron beam that has been transmitted through the specimen;

a detector configured to photograph the image; and an aberration corrector comprising:

a first multipole, a second multipole, a third multipole and a fourth multipole arranged along an optical axis;

a first transfer lens system arranged between the first multipole and the second multipole;

a second transfer lens system arranged between the second multipole and the third multipole; and a third transfer lens system arranged between the third multipole and the fourth multipole, each of the first multipole, the second multipole, the third multipole, and the fourth multipole generating a three-fold symmetric field, a sixth-order three-lobe aberration generated in the first multipole and the second multipole and a sixth-order three-lobe aberration generated in the third multipole and the fourth multipole cancel each other out; and a six-fold astigmatism is corrected by:

a six-fold astigmatism generated by the three-fold symmetric fields respectively generated by the first multipole, the second multipole, the third multipole, and the fourth multipole; and a six-fold astigmatism generated by a combination aberration of spherical aberrations respectively created in the first transfer lens system, the second transfer lens system, and the third transfer lens system and aberrations created by the three-fold symmetric fields respectively generated by the first multipole, the second multipole, the third multipole, and the fourth multipole.

* * * * *